United States Patent
Karlsen

(10) Patent No.: US 7,444,046 B2
(45) Date of Patent: Oct. 28, 2008

(54) DIODE LASER ARRAY COUPLING OPTIC AND SYSTEM

(75) Inventor: Scott R. Karlsen, Battle Ground, WA (US)

(73) Assignee: nLight Photonics Corporation, Vancouver, WA (US)

( * ) Notice: Subject to any disclaimer, the term of this patent is extended or adjusted under 35 U.S.C. 154(b) by 195 days.

(21) Appl. No.: 11/252,778

(22) Filed: Oct. 18, 2005

(65) Prior Publication Data

US 2007/0086501 A1    Apr. 19, 2007

(51) Int. Cl.
- G02B 6/32 (2006.01)
- G02B 6/04 (2006.01)
- H01S 5/00 (2006.01)

(52) U.S. Cl. .............. 385/33; 385/31; 385/39; 385/47; 385/115; 385/116; 372/50.12; 372/50.23

(58) Field of Classification Search ............ 372/50.23; 385/33

See application file for complete search history.

(56) References Cited

U.S. PATENT DOCUMENTS

| | | | |
|---|---|---|---|
| 5,127,068 A | | 6/1992 | Baer et al. |
| 5,307,430 A | * | 4/1994 | Beach et al. .............. 385/31 |
| 5,375,138 A | * | 12/1994 | Kozlovsky et al. ........... 372/92 |
| 5,436,990 A | | 7/1995 | Head et al. |
| 5,579,422 A | | 11/1996 | Head et al. |
| 5,734,766 A | * | 3/1998 | Flint ........................ 385/43 |
| 5,949,932 A | | 9/1999 | Lawrenz-Stolz |
| 6,005,717 A | * | 12/1999 | Neuberger et al. .......... 359/619 |
| 6,407,870 B1 | * | 6/2002 | Hurevich et al. ............ 359/668 |
| 6,785,440 B1 | * | 8/2004 | Lawrenz-Stolz ............ 385/33 |
| 7,027,691 B1 | * | 4/2006 | Nold et al. ................ 385/43 |
| 2003/0099267 A1 | * | 5/2003 | Hennig et al. .............. 372/36 |
| 2003/0193720 A1 | * | 10/2003 | Beach et al. ............... 359/623 |
| 2003/0228100 A1 | | 12/2003 | Kikuchi et al. |
| 2004/0033024 A1 | * | 2/2004 | Remillard et al. ........... 385/49 |
| 2004/0174604 A1 | * | 9/2004 | Brown ...................... 359/618 |
| 2006/0159147 A1 | * | 7/2006 | Grenier et al. ............ 372/50.12 |

* cited by examiner

*Primary Examiner*—Frank G Font
*Assistant Examiner*—Ryan Lepisto
(74) *Attorney, Agent, or Firm*—Patent Law Office of David G. Beck

(57) ABSTRACT

A single piece optic for coupling the output of a diode laser array into an optical fiber array is provided. The coupling optic has a planar back surface which, during use with a diode laser array, is positioned substantially parallel to the front face of the laser array. The coupling optic is fabricated from a single substrate and is comprised of a plurality of optical elements. Depending upon the technique used to fabricate the optical elements, the individual optical elements may be trapezoidally-shaped or rectangularly-shaped. The front surface of each optical element is tilted, thus preventing reflected laser radiation from resonating within the diode laser's emitters. Preferably the wedge angle for the tilted front surface is greater than 2 mrad, thus accomplishing the goal of limiting feedback into the emitters, and less than 4 mrad, thus reducing beam steering. Additionally each optical element is shaped to reduce the divergence of the emitters in the fast axis, thus allowing the output from each emitter to be effectively coupled into the corresponding optical fiber.

20 Claims, 5 Drawing Sheets

DIODE LASER ARRAY COUPLING OPTIC AND SYSTEM

FIELD OF THE INVENTION

The present invention relates generally to diode lasers and, more particularly, to a method and apparatus for coupling the output of a diode laser array to a fiber array.

BACKGROUND OF THE INVENTION

The beam quality, or brightness, of high power diode laser arrays is generally very poor, and thus inadequate for many applications. A simple approach to improving the output from such an array is to couple each element of the array into a corresponding fiber in a linear fiber array. The output end of the fiber array can be arranged, as desired, for example into a circular bundle. While this approach improves the beam quality in the slow axis, it reduces the beam quality in the fast axis. Further improvement in beam quality can be achieved by interposing coupling optics between the diode laser array and the fiber array.

U.S. Pat. No. 5,127,068 discloses using a small diameter multimode optical fiber as the coupling optics between a diode laser and a butt coupled optical fiber, the optical fiber selected for the coupling optics having a diameter approximately equivalent to the diameter of the fiber to be coupled to the diode laser, and approximately 20% to 50% larger than the lateral dimension of the diode laser of the diode array. Additionally the patent discloses that the selected optical coupling fiber should have a low numerical aperture in order to collimate the high numerical aperture direction of the diode laser emission.

U.S. Pat. No. 5,436,990, a continuation-in-part of U.S. Pat. No. 5,127,068, discloses a system for coupling the output from a diode laser bar into an optical fiber bundle. The mounting system includes means for mounting the coupling optic, consisting of a small diameter multimode optical fiber, to the diode laser bar in a thermally stable configuration.

U.S. Pat. No. 5,949,932 discloses an assembly for focusing and coupling the output of a semiconductor laser into an optical fiber, the assembly including a cylindrical lens interposed between the output surface of the laser and the input surface of the optical fiber. The diameter of the disclosed cylindrical lens is on the order of the core diameter of the optical fiber and, in a preferred embodiment, is comprised of a glass fiber lens glued, fused, or melted onto the input surface of the optical fiber. The cylindrical lens is oriented substantially at a right angle to the optical fiber. In an alternate configuration utilizing a fiber array rather than a single optical fiber, the cylindrical lens is comprised of multiple individual cylindrical lens assemblies which correspond to the number and arrangement of the individual fibers of the array. In this configuration, each individual cylindrical lens is bonded onto the input surface of a corresponding optical fiber.

A variety of optical systems have been designed to couple the output of a diode laser array into an optical fiber or fiber array, these systems utilizing one or more cylindrical lenses. In order to achieve a stable output from the system, both in terms of output spectrum and power, it is critical that the cylindrical lens does not scatter or reflect the emissions of the diode laser back into the diode. As a result of this constraint, the cylindrical lens is coated with an anti-reflection (AR) coating to reduce reflections. Additionally, the cylindrical lens is typically tilted off-angle to further reduce feedback. Unfortunately alignment of the AR coated surfaces as well as properly positioning the cylindrical lens is a time consuming process. Accordingly, what is needed in the art is a means for efficiently coupling the output from a diode laser array into an optical fiber or fiber array, the coupling means being relatively easy to position. The present invention provides such a coupling means.

SUMMARY OF THE INVENTION

The present invention provides an optic for use in coupling the output of a diode laser array into an optical fiber array. The coupling optic has a planar back surface which, during use with a diode laser array, is positioned substantially parallel to the front face of the laser array. In one aspect of the invention, the coupling optic is fabricated from a single substrate and is comprised of a plurality of optical elements. The center to center spacing of the optical elements matches that of both the emitters of the diode laser array and the individual fibers of the optical fiber array. The front surface of each optical element is tilted, thus preventing reflected laser radiation from resonating within the diode laser's emitters. Preferably the wedge angle for the tilted front surface is greater than 2 mrad, thus accomplishing the goal of limiting feedback into the emitters, and less than 4 mrad, thus reducing beam steering. Additionally each optical element is shaped to reduce the divergence of the emitters in the fast axis, thus allowing the output from each emitter to be effectively coupled into the corresponding optical fiber.

In another aspect of the invention, the coupling optic is fabricated from a single substrate in order to form the single piece optic. The optical elements of the coupling optic can be formed by gray scale photolithography, photoresist reflow techniques, or other means. Depending upon the technique used to fabricate the optical elements, the individual optical elements may be trapezoidally-shaped or rectangularly-shaped.

In at least one embodiment of the invention, AR coatings are applied to the surfaces of the optical elements of the coupling optic that are adjacent to the output facets of the diode laser array and the input surfaces of the optical fibers, thereby further reducing reflections and scattered light from entering into the emitters.

In at least one embodiment of the invention, a laser assembly is made using the coupling optic of the invention. The coupling optic is bonded to a mounting bracket, for example with a UV cured or a thermally cured epoxy. The mounting bracket is attached to the diode laser array, for example by bonding or soldering the bracket to a diode laser array mounting member to which the diode laser array is affixed. The diode laser array mounting member and an optical fiber array mounting member are both attached to an assembly mount.

A further understanding of the nature and advantages of the present invention may be realized by reference to the remaining portions of the specification and the drawings.

DESCRIPTION OF THE SPECIFIC EMBODIMENTS

Figure 1:
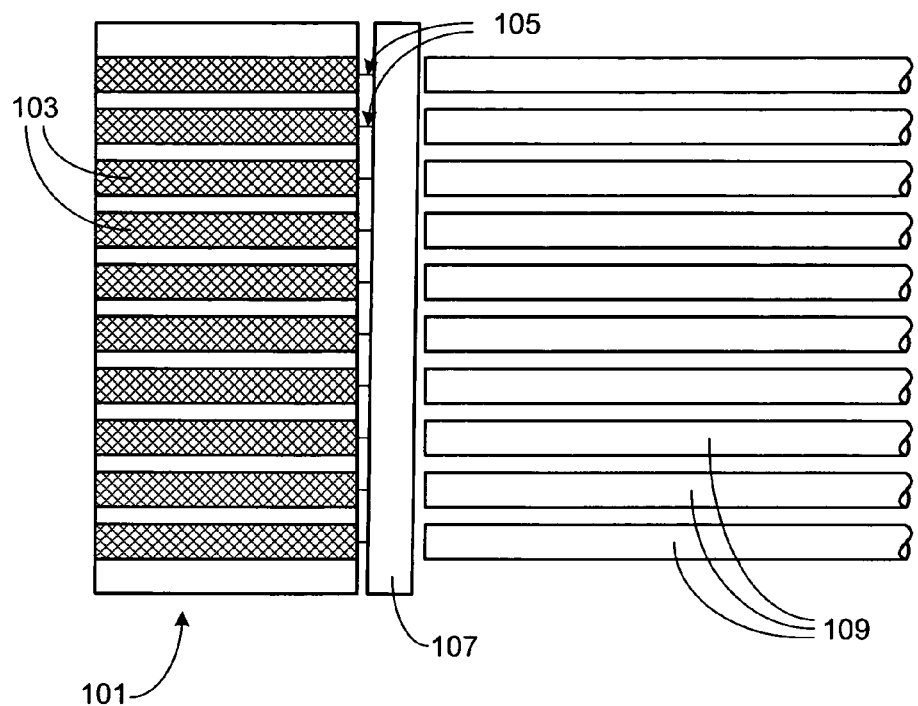
FIG. 1 is an illustration of a diode laser array and a conventional optical system according to the prior art.

FIG. 1 is an illustration of a diode laser array 101 (e.g., a diode laser bar or stack) consisting of a plurality of emitters 103, each emitting a beam of radiation 105. In accordance with the prior art, a cylindrical lens 107 is positioned between array 101 and a plurality of optical fibers 109. Cylindrical lens 107 compensates for the high angular divergence in the direction perpendicular to the diode junction of the emitters, typically reducing the beam divergence in the fast axis to less than that of the slow axis, thereby easing the assembly tolerances of the overall system compared to an assembly which does not use any coupling optics (i.e., one in which each fiber is simply placed in close proximity to the emitter to which it is to be coupled).

In a typical diode laser array 101, emitters 103 will have multiple spatial modes. As a result, optical fibers 109 are preferably multi-mode as well. Since the optical fibers are multi-mode, coupling lens 107 does not have to be of extremely high optical quality. In order to achieve high fiber coupling efficiency, however, fibers 109 should be located within a fraction of the slow axis Rayleigh range to insure that the slow axis of emitters 103 do not overfill the corresponding fibers. Therefore even the use of coupling optics as disclosed by the prior art does not relax the assembly tolerances of the system to the desired degree.

Figure 2:
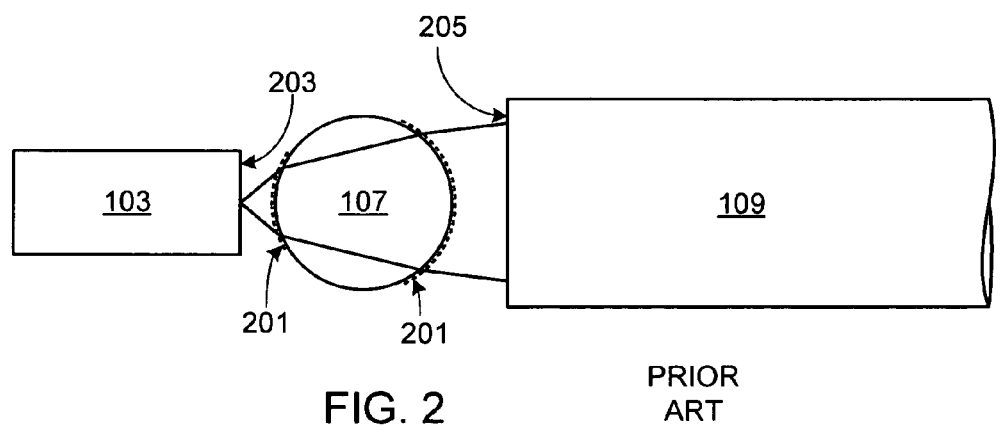
FIG. 2 is a cross-sectional view of the assembly shown in FIG. 1 which illustrates rotation of the coupling optics to properly orient the AR coated surfaces relative to the emitter output facet and the fiber optic input surface.

In addition to the need to properly fill fibers 109, coupling optic 107 must also be designed to minimize emitter radiation from re-entering diode laser array 101. One approach to such minimization is to tilt optic 107 relative to the output facets of emitters 103. FIG. 1 shows cylindrical lens 107 tilted, the degree of tilt being exaggerated in the figure for illustration purposes. In order to further minimize scattered and reflected laser emissions, optic 107 is preferably coated with an AR coating. Due to the difficulty in achieving a uniform coating on a cylindrical optical component, typically cylindrical lens 107 is rotated so that the optimally AR coated surfaces 201 are oriented towards the output facets 203 of emitters 103 and the input surfaces 205 of fibers 109 as shown in FIG. 2.

Figure 3:
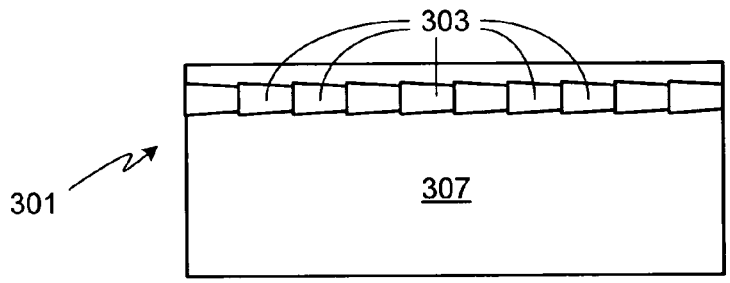
FIG. 3 is a front view of a coupling optic designed in accordance with the invention.
Figure 4:
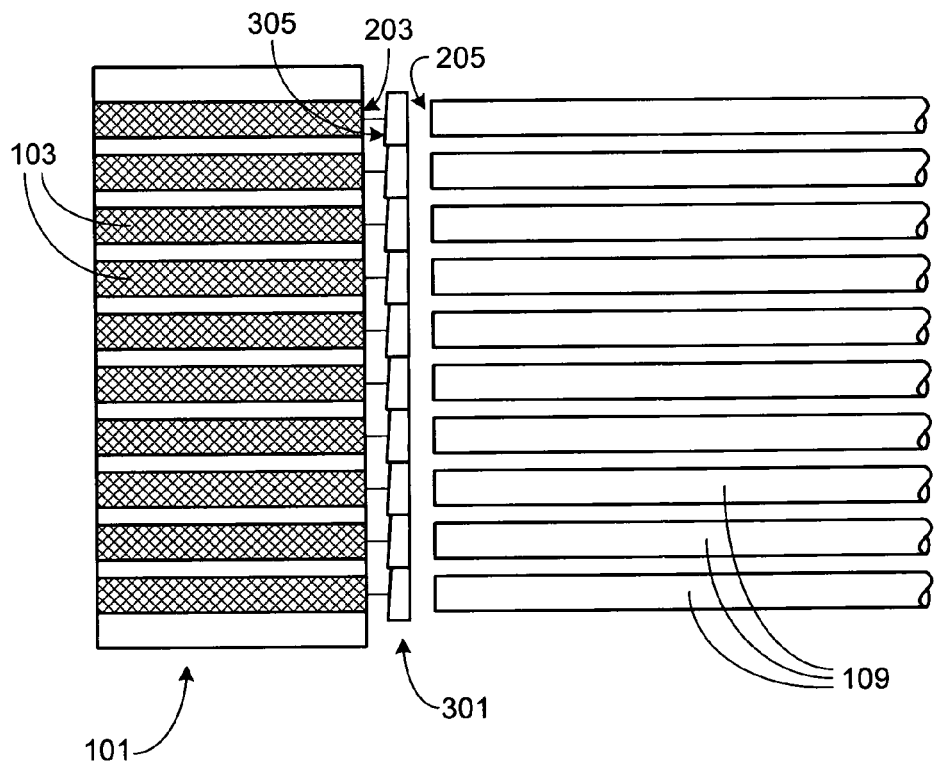
FIG. 4 is a top view of the coupling optic of FIG. 3, shown with a diode laser array and a plurality of optical fibers.

FIG. 3 is a front view of a coupling optic 301 designed in accordance with one embodiment of the invention. FIG. 4 is a top view of the same optic 301, showing the coupling optic positioned within a system such as the system shown in FIG. 1. As illustrated, optic 301 is comprised of multiple optical elements 303 which correspond, one-to-one, with the plurality of emitters 103 and the plurality of optical fibers 109. In the view shown in FIG. 3, each optical element 303 has a trapezoidal shape, and more preferably an isosceles trapezoidal shape as shown. As seen from the top view shown in FIG. 4, tilted surfaces 305 of each optical element 303 are adjacent to emitter output facets 203, thus preventing reflected laser radiation from resonating within emitters 103. Note that the degree of tilt of surfaces 305 is exaggerated in FIGS. 4 and 6 in order to better convey the principles of the invention.

Figure 5:
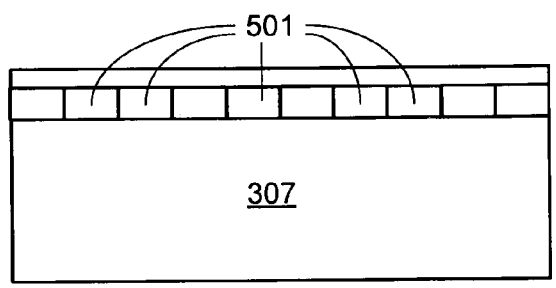
FIG. 5 is a front view of a coupling optic designed in accordance with an alternate embodiment of the invention.

Although optic 301 is comprised of a plurality of optical elements 303 which correspond to the plurality of emitters 103, elements 303 are not independent optical elements that have been bonded or otherwise combined into a single optic. Rather, optic 301 is fabricated as a single piece optic which includes multiple optical elements. This is an important aspect of the invention, as it eliminates the otherwise extremely time consuming process of individually aligning each optical element 303. Coupling optic 301 can be fabricated by any of several means. For example, optic 301 can be fabricated using a binary mask with photoresist reflow. The photoresist reflow technique requires the use of a trapezoid shaped mask, the mask creating slightly different sag heights at either end of each optical element 303. A different vertex height at each end of each element 303 is all that is needed to introduce the desired tilt for these elements since the undesired back reflection that can couple into diode laser 101 originates from the vertex of the lens. Alternately, the one piece coupling optic of the invention can be fabricated using gray scale photolithography. The pattern created using this technique is etched into a wafer of suitable material. Using this technique, preferably the individual optical elements are rectangularly-shaped as shown in FIG. 5 (i.e., elements 501). The top view of elements 501 would appear the same as that of elements 303 in FIG. 4.

As a result of the approach used to fabricate the coupling optic of the invention, in addition to optical elements 303 (or elements 501), the coupling optic also includes a substrate portion 307. Substrate portion 307 provides a convenient means of bonding or otherwise attaching the optic to the laser/fiber array assembly.

Preferably the coupling optic of the invention is fabricated from a material with a high refractive index, such as gallium phosphide (GaP), or a high index glass such as Ohara S-TIH53 or Schott SFL57. At emission wavelengths above 1.3 microns, silicon or a low refractive index material such as fused silica can be used. The advantage of using a high index material is that the optical coupling efficiency will be higher. Additionally, the sag height of the lenses is lower with high index materials, making the fabrication of the coupling optic easier.

Figure 6:
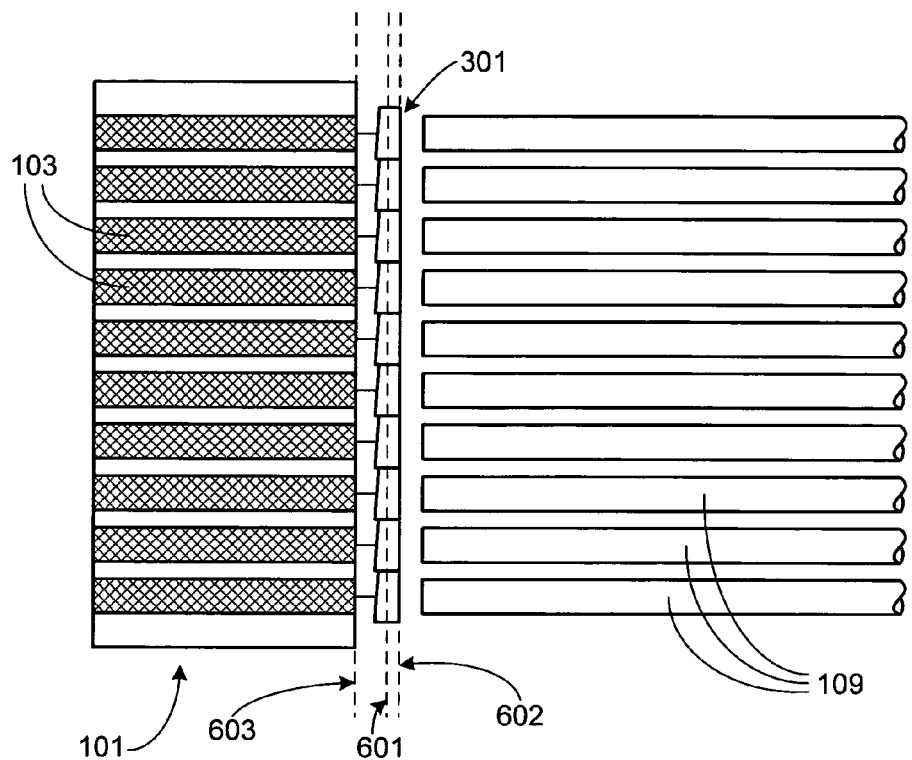
FIG. 6 illustrates the position of the coupling optic shown in either FIG. 3 or FIG. 5 relative to the diode laser array.

An advantage of using a single piece coupling optic in which the individual optical elements are tilted, as disclosed herein, is the simplification of the assembly process. Rather than having to accurately tilt the coupling optic (e.g., optic 107 of FIG. 1) or individual optical elements, the central axis 601 of optical elements 303 (or elements 501), or the back planar surface 602 of the coupling optic (and optical elements 303 or 501), is simply positioned parallel to exit face 603 of diode laser array 101 (i.e., as shown in FIG. 6), the shape of elements 303 (or elements 501) providing the desired tilt.

Figure 7:
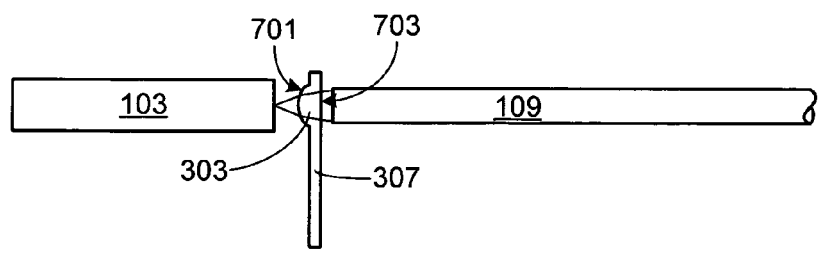
FIG. 7 is a cross-sectional view of an individual optical element of the coupling optic shown in either FIG. 3 or FIG. 5.

FIG. 7 is a cross-sectional view of a single optical element 303 (or element 501), each optical element being shaped to effectively reduce the beam divergence in the fast axis of each emitter 103. Basically the face 701 of each optical element 303 (or element 501) is shaped in order to form a simple collimating optic, the collimating optic primarily, or only, affecting the beam divergence in the fast axis, thus allowing the output from each emitter 103 to be effectively coupled into each corresponding fiber 109. It will be appreciated that the exact design of face 701 and element 303 (or element 501) depends on the divergence (i.e., numerical aperture) of emitters 103, the diameter of optical fibers 109, and the desired distances separating optic 301 from diode laser 101 and fibers 109. As the design of such an optic is well within the level of ordinary skill in the art, further description is not provided herein.

Preferably surfaces 701 (i.e., tilted surfaces 305), which are adjacent to diode laser 101, as well as planar back surfaces 703 which are adjacent to fibers 109, are AR coated to further reduce the amount of back reflections and scattered light that can re-enter diode laser 101. Unlike a cylindrical coupling lens (e.g., lens 107) which must be rotated to properly position the AR coated surfaces, such positional difficulties do not arise with the use of AR coated coupling optic 301 due to the unique shape of the optic.

A limitation of coupling optic 301 is that the individual optical elements steer the laser beams in the axes with the wedge (i.e., a prism effect). Accordingly optical elements 303 (or elements 501) are preferably designed so that beam steering is kept to less than 0.5 degrees, thus minimizing increases in the numerical aperture of the laser radiation coupled into the optical fiber array. The inventor has found that the wedge angle should be less than approximately 4 mrad to reduce beam steering, but greater than approximately 2 mrad to prevent feedback. If desired, it is possible to compensate for the beam steering by either positioning the optical fibers in the array at an angle, or fabricating an equal, but reversed, wedge on the back surface of each optical element 303 (not shown).

Figure 8:
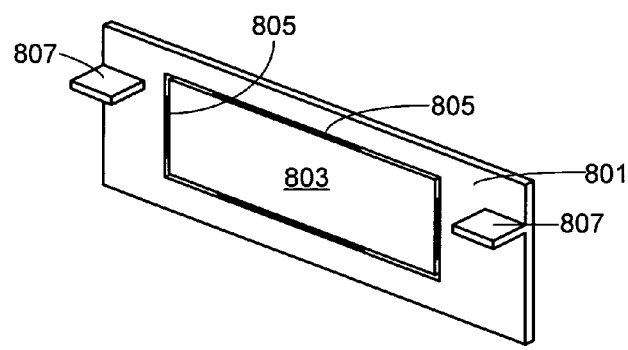
FIG. 8 is a perspective view of a preferred embodiment of mounting bracket for use with the coupling optic of the invention.
Figure 9:
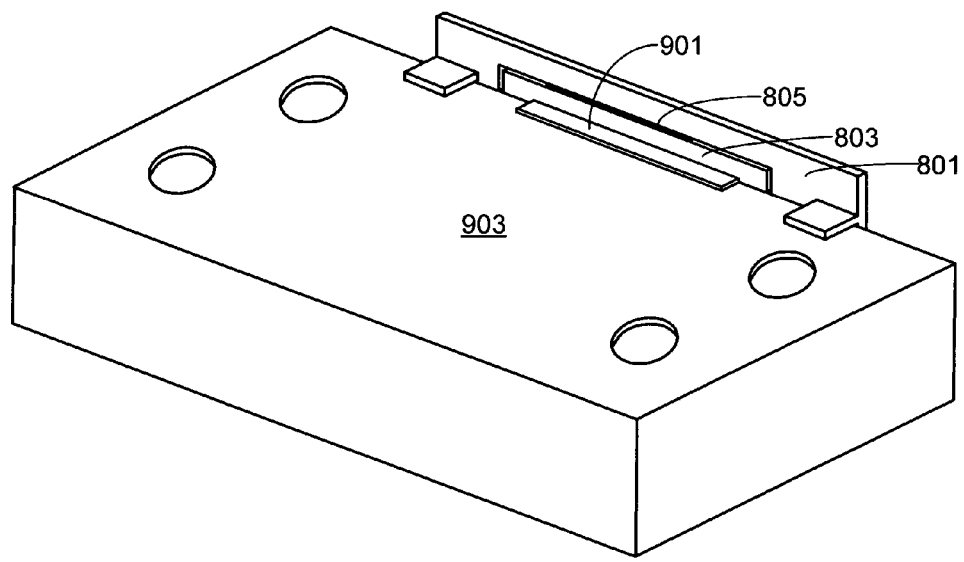
FIG. 9 is a perspective view of the mounting bracket shown in FIG. 8 coupled to a diode laser mounting member.
Figure 10:
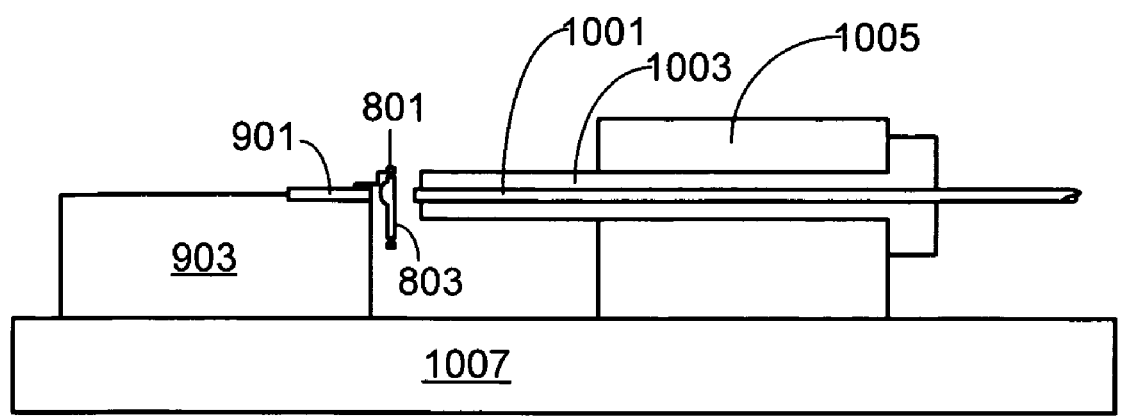
FIG. 10 is a cross-sectional, orthogonal view of the embodiments illustrated in FIGS. 8 and 9, FIG. 10 including the optical fiber assembly.

FIGS. 8-10 illustrate a preferred embodiment of a coupling optic mounting configuration. FIG. 8 is a perspective view of a mounting bracket 801. Bonded within bracket 801 is a coupling optic 803 designed as described above relative to FIGS. 3-7. In the preferred embodiment of the invention, coupling optic 803 is fabricated on a substrate that is approximately 2 millimeters by 13 millimeters. Each individual optical element (i.e., elements 303 or 501) is 500 microns long and approximately 250 microns wide at the center, with an element to element spacing of 500 microns. Preferably optic 803 is bonded to bracket 801 with either a UV cured or a thermally cured epoxy 805, for example either Ablebond A4057 from Ablestik or OP-63-LS from Dymax.

As shown in the perspective view of FIG. 9, diode laser array 901 is affixed to mounting member 903. In the preferred embodiment, diode laser array 901 is comprised of 19 emitters with an individual emitter width of either 100 microns or 150 microns and a center to center spacing of 500 microns, thus matching the center to center spacing of the individual optical elements of coupling optic 803. Mounting member 903 is preferably fabricated from a thermally conductive material (e.g., copper) in order to provide an efficient means of transferring heat from diode laser array 901. Mounting bracket 801 is attached to mounting member 903, thereby positioning coupling optic 803 directly in front of, and adjacent to, diode laser array 901. As previously described, there is a one to one correspondence of the individual optical elements of optic 803 with the individual emitters of diode laser array 901. Coupling tabs 807 of mounting bracket 801 can be soldered or bonded to mounting member 903.

FIG. 10 is a schematic diagram of an assembly utilizing the components illustrated in FIGS. 8 and 9. FIG. 10, as with the other figures shown herein, is not drawn to scale. In particular, FIG. 10 is only meant to provide a general understanding of the preferred mounting arrangement.

As previously described, both diode laser array 901 and coupling optic mounting bracket 801 are attached to mounting member 903, bracket 801 used to align optic 803 relative to the individual emitters of diode laser array 901. As shown in FIG. 10, the end portions of the individual optical fibers 1001 of the optical fiber array are captured within fiber end mounting member 1003. Fiber end mounting member 1003 is, in turn, attached to fiber array mounting bracket 1005. Both fiber array mounting bracket 1005 and mounting member 903 are attached to assembly mount 1007. In the preferred embodiment, the diameter of fibers 1001 is approximately equal to the emitter width (i.e., 100 microns or 150 microns in this embodiment) and have the same center to center spacing as the emitters (i.e., 500 microns in this embodiment).

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A laser system comprising:
   a diode laser array comprised of a plurality of emitters, wherein each of said plurality of emitters emits an output beam from an output facet, and wherein each of said output beams has a fast axis of divergence and a slow axis of divergence; and
   a one piece coupling optic adjacent to said output facets of said plurality of emitters of said diode laser array, wherein said one piece coupling optic has a planar back surface which is substantially parallel to a front face of said diode laser array, and wherein said one piece coupling optic further comprises a plurality of optical elements corresponding to said plurality of emitters, wherein each of said plurality of optical elements has a tilted front surface, and wherein each of said plurality of optical elements is shaped to reduce said fast axis of divergence of said output beam of said corresponding emitter of said plurality of emitters; and an optical fiber array comprised of a plurality of optical fibers, wherein said plurality of optical fibers correspond to said plurality of optical elements and said plurality of emitters.

2. The laser system of claim 1, wherein said one piece coupling optic is interposed between said diode laser array and said optical fiber array.

3. The laser system of claim 1, wherein said tilted front surface of each of said plurality of optical elements is adjacent to said output facet of said corresponding emitter of said plurality of emitters, and wherein said planar back surface of each of said plurality of optical elements is adjacent to an input surface of said corresponding optical fiber of said optical fiber array.

4. The laser system of claim 3, further comprising a first AR coating on said tilted front surface of each of said plurality of optical elements and a second AR coating on said planar back surface of each of said plurality of optical elements.

5. The laser system of claim 1, wherein a diameter corresponding to each of said plurality of optical fibers of said optical fiber array is approximately equal to a width corresponding to each of said plurality of emitters of said diode laser array.

6. A The laser system comprising:
   a diode laser array comprised of a plurality of emitters, wherein each of said plurality of emitters emits an output beam from an output facet, and wherein each of said output beams has a fast axis of divergence and a slow axis of divergence; and
   a one piece coupling optic adjacent to said output facets of said plurality of emitters of said diode laser array, wherein said one piece coupling optic has a planar back surface which is substantially parallel to a front face of said diode laser array, and wherein said one piece coupling optic further comprises:

a plurality of optical elements corresponding to said plurality of emitters, wherein each of said plurality of optical elements has a tilted front surface, and wherein each of said plurality of optical elements is shaped to reduce said fast axis of divergence of said output beam of said corresponding emitter of said plurality of emitters, wherein a wedge angle corresponding to said tilted front surface of each of said plurality of optical elements is greater than 2 mrad and less than 4 mrad.

7. The laser system of claim 6, wherein each of said plurality of optical elements is trapezoidally-shaped.

8. The laser system of claim 6, wherein each of said plurality of optical elements is rectangularly-shaped.

9. The laser system of claim 6, wherein said tilted front surface of each of said plurality of optical elements is adjacent to said output facet of said corresponding emitter of said plurality of emitters.

10. The laser system of claim 6, further comprising a coupling optic mounting bracket, wherein said one piece coupling optic is bonded to said coupling optic mounting bracket, and wherein said coupling optic mounting bracket is attached to said diode laser array.

11. The laser system of claim 6, further comprising:
a coupling optic mounting bracket, wherein said one piece coupling optic is bonded to said coupling optic mounting bracket;
a diode laser array mounting member, wherein said diode laser array is attached to said diode laser array mounting member; and
wherein said coupling optic mounting bracket is attached to said diode laser array mounting member.

12. The laser system of claim 6, further comprising:
a first AR coating applied to said tilted front surface of each of said plurality of optical elements of said one piece coupling optic, wherein said tilted front surface of each of said plurality of optical elements is adjacent to said output facet of said corresponding emitter of said plurality of emitters; and
a second AR coating applied to said planar back surface of each of said plurality of optical elements.

13. A laser system comprising:
a diode laser array comprised of a plurality of emitters, wherein each of said plurality of emitters emits an output beam, and wherein each of said output beams has a fast axis of divergence and a slow axis of divergence;
an optical fiber array comprised of a plurality of optical fibers, wherein said plurality of optical fibers corresponds to said plurality of emitters; and
a one piece coupling optic interposed between said diode laser array and said optical fiber array, wherein said one piece coupling optic has a planar back surface which is substantially parallel to a front face of said diode laser array, and wherein said one piece coupling optic further comprises:
a plurality of optical elements corresponding to said plurality of emitters and said plurality of optical fibers, wherein each of said plurality of optical elements has a tilted front surface and a planar back surface, said tilted front surface adjacent to an emitter output facet of said corresponding emitter of said plurality of emitters and said planar back surface adjacent to an input surface of said corresponding optical fiber of said optical fiber array, and wherein each of said plurality of optical elements is shaped to reduce said fast axis of divergence of said output beam of said corresponding emitter of said plurality of emitters.

14. The laser system of claim 13, wherein each of said plurality of optical elements is trapezoidally-shaped.

15. The laser system of claim 13, wherein each of said plurality of optical elements is rectangularly-shaped.

16. The laser system of claim 13, further comprising a first AR coating on said tilted front surface of each of said plurality of optical elements and a second AR coating on said planar back surface of each of said plurality of optical elements.

17. The laser system of claim 13, wherein a diameter corresponding to each of said plurality of optical fibers of said optical fiber array is approximately equal to a width corresponding to each of said plurality of emitters of said diode laser array.

18. The laser system of claim 13, wherein a wedge angle corresponding to said tilted front surface of each of said plurality of optical elements is greater than 2 mrad and less than 4 mrad.

19. The laser system of claim 13, further comprising a coupling optic mounting bracket, wherein said one piece coupling optic is bonded to said coupling optic mounting bracket, and wherein said coupling optic mounting bracket is attached to said diode laser array.

20. The laser system of claim 13, further comprising:
a coupling optic mounting bracket, wherein said one piece coupling optic is bonded to said coupling optic mounting bracket;
a diode laser array mounting member, wherein said diode laser array is attached to said diode laser array mounting member; and
wherein said coupling optic mounting bracket is attached to said diode laser array mounting member.

* * * * *